BIPOLAR MOS FIELD EFFECT TRANSISTOR

Filed Aug. 31, 1967 2 Sheets-Sheet 1

INVENTOR.
PAUL RICHMAN
BY Joseph H. Roediger
ATTORNEY.

March 10, 1970 P. RICHMAN 3,500,138

BIPOLAR MOS FIELD EFFECT TRANSISTOR

Filed Aug. 31, 1967 2 Sheets-Sheet 2

INVENTOR.
PAUL RICHMAN
BY Joseph H. Roediger
ATTORNEY.

United States Patent Office 3,500,138

Patented Mar. 10, 1970

3,500,138

BIPOLAR MOS FIELD EFFECT TRANSISTOR

Paul Richman, Bayside, N.Y., assignor to General Telephone & Electronics Laboratories Incorporated, a corporation of Delaware Filed Aug. 31, 1967, Ser. No. 664,778
Int. Cl. H01l 11/00, 11/14
U.S. Cl. 317—235 8 Claims

ABSTRACT OF THE DISCLOSURE

A bipolar metal-oxide-semiconductor (MOS) transistor having a high resistivity substrate and low resistivity source and drain regions is provided with an insulated gate structure which has a substantial overlap of the source region. The overlapping by the gate electrode results in the breakdown of a reverse biased PN junction formed within the source region during operation thereby permitting the transistor to be operated as either a P channel or an N channel device.

BACKGROUND OF THE INVENTION

This invention relates to metal-oxide-semiconductor (MOS) field effect transistors and more particularly to a bipolar MOS transistor which is capable of operating as either an N channel or P channel device.

The theory and operation of the conventional MOS transistor are contained in an article entitled "The Silicon Insulated Gate Field-Effect Transistor" by F. P. Heiman and S. R. Hofstein appearing in the September 1963—Proceedings of the IEEE. The increasing interest in MOS transistors and other field effect devices having similar structures is due primarily to the fact that the fabrication techniques utilized in making MOS transistors are considerably less complicated than the techniques employed to produce bipolar junction transistors and integrated circuits.

Generally, MOS transistors may be categorized as either P channel or N channel units depending on the conduction process taking place within the device. The P channel units relay on hole conduction between heavily doped P-type drain and source regions diffused into an N-type semiconductor substrate. A P-channel unit operates in the enhancement mode with the application of a negative gate voltage establishing a highly conductive P type inversion layer at the substrate surface. On the other hand, an N channel unit utilizes electron conduction between the source and drain regions. This unit is operated in the enhancement mode when a positive gate voltage modulates the conductivity of the surface of its P-type substrate. The source and drain regions in the P-type substrate are doped heavily to N-type conductivity.

In both types of units, the source and drain regions are formed so as to have the conductivity type which is opposite to that of the substrate. This configuration has been required to insure that a reverse biased PN junction blocks the path of current flow from drain to source in the device when the gate voltage is zero. Thus, this junction enables the device to achieve an off state. In addition, only one type of carrier takes part in the conduction mechanism occurring in a conventional MOS transistor. As a result, the device is characterized as unipolar.

SUMMARY OF THE INVENTION

The present invention is concerned with a bipolar MOS transistor which employs hole conduction in its P channel mode of operation and electron conduction in its N channel mode of operation.

The bipolar MOS transistor fabricated in accordance with this invention includes a high resistivity semiconductive substrate of a single conductivity type having spaced first and second row resistivity regions formed therein. The first and second regions, herein termed the source and drain regions respectively, may possess the same conductivity type as the substrate. The bipolar MOS transistor also includes means for modulating the conductivity of a surface channel of the substrate formed in the separation between the source and the drain regions. In addition, the modulating means is required to be positioned so that it can also modulate the conductivity of a portion of the source region.

Generally, the modulating means of a MOS transistor comprises an insulating film formed on the surface of the substrate overlying the separation between the source and drain regions in combination with an overlying gate electrode. In the present device, the insulating film and the gate electrode are required to substantially overlap the source region. This overlapping of the source region by the gate electrode in combination with the high resistivity substrate and low resistivity source and drain regions permits the present device to operate as either a P channel or N channel transistor depending on the bias conditions.

While the device may utilize either a high resistivity P type ($\pi$) substrate or a high resistivity N type ($\nu$) substrate with low resistivity P-type or N-type source and drain regions, the following brief description refers to an embodiment utilizing a $\pi$ substrate in combination with P type source and drain regions. With the source region and the substrate coupled to a reference potential, i.e., ground, the application of negative voltages to the gate and drain places the device in the P channel mode of operation. The negative gate voltage establishes a highly conductive P type accumulation layer at the surface of the substrate which serves as the conducting channel between the source and drain. By employing a high resistivity $\pi$ substrate, the bulk of the substrate constitutes a high impedance conducting path and, thus, insures that the substrate does not provide a low impedance path shunting the channel. When the gate voltage is zero, the reverse-biased PN junction at the drain-substrate interface occurring in conventional P channel MOS transistors is not present in this device. Instead, the flow of leakage current is found to be inhibited by the $P—\pi$ drain-substrate interface. The characteristics of this interface establish the "off" state of the device.

The application of positive voltages to the drain and gate places the device in the N channel mode of operation. The positive gate voltage inverts the surface of the $\pi$ substrate and forms an N-type channel in the separation between the source and drain regions. The PN junction formed at the interface of the drain region and the conducting channel is forward biased to permit conduction therethrough. Essentially no conduction occurs through the bulk of the substrate due to the $P—\pi$ interfaces formed between the drain and source regions and the bulk of the substrate.

The portion of the source region that is overlapped by the gate is also inverted by the electric field directly above in the insulating film. This results in the formation of a reverse biased PN junction in the source region. This junction is found to break down by means of tunnel emission and thereby complete the conducting channel between drain and source. When the gate voltage decreases to zero, the inversion layer in the source region is no longer present and the conducting path from drain to source is blocked, creating the "off" state for N channel operation. Thus, the present transistor is capable of operation as either an N channel or P channel device depending only on the biasing conditions.

To enable the inversion layer to be formed in the source region, it has been found necessary to provide an overlap of at least 10 microns between the gate electrode and the source region. In practice, the overlap is normally maintained at less than 25 microns to minimize the interelectrode capacitance and the resultant lowering of the high frequency cut-off point. Further, the impurity concentration of the source region is required to be relatively low, for example at least as low as $10^{20}$ carriers per $cm.^3$ in silicon, in order to insure that an inversion layer can be established therein at gate voltage levels lower than the breakdown voltage of the insulating layer. However, the impurity concentration of the source region is required to be at least as high as that necessary to make the region degenerate, i.e., obtain an overlap between the valence and conduction bands in the energy level structure of the field induced junction. Without this band overlap, tunnel emission cannot break down the junction and the device will be incapable of operating in both the P channel and N channel modes of operation.

The ability of the present device to operate in the P or N channel mode depending only on the biasing conditions renders the device well suited for inclusion in linear integrated circuits wherein both N and P channel devices are required. Further features and advantages of the invention will become more readily apparent from the following detailed description of a specific embodiment when taken in conjunction with the accompanying drawings.

DESCRIPTION OF THE PREFERRED EMBODIMENT

Figure 1:
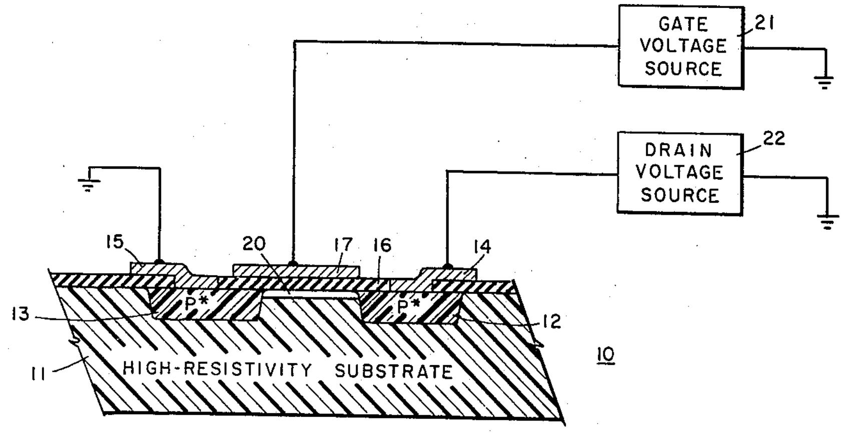
FIG. 1 is a side view of section of one embodiment of the invention.

Referring now to FIG. 1, a bipolar MOS transistor 10 is shown comprising a high resistivity semiconductor body or substrate 11 having first and second regions 12 and 13 of the same conductivity type formed therein. Each region 12, 13 is provided with a corresponding electrical contact 14, 15. Contact 14 is formed on region 12 and will be referred to herein as the drain electrode. Contact 15, formed on region 13, is referred to herein as the source electrode. Regions 12 and 13 are designated with a superscript * to indicate that the conductivity of these regions is substantially greater than that of substrate 11, but that the surface doping concentration is less than that used for the drain and source regions of conventional MOS transistors. In the conventional MOS transistor, the drain and source regions are doped to the solid solubility of the impurity in the substrate and are designated by the symbol +.

The means for modulating the conductivity of a surface conducting channel in substrate 11 comprises insulating film 16 and gate electrode 17. As shown, insulating film 16 is formed on the surface of substrate 11 and extends between the source and drain electrodes. Gate electrode 17 is formed on the upper surface of insulating film 16. It shall be noted that both film 16 and gate electrode 17 overlie a substantial portion of source region 13 in addition to overlying the separation between the regions. For reasons that will later be explained, this overlap exceeds 10 microns.

A conducting channel 20 is shown in FIG. 1 for purposes of illustration. This channel is established at the interface of substrate 11 and film 16 by the flow of carriers within the substrate as a result of a voltage being applied to gate electrode 17. The gate voltage provides an electric field normal to the surface of substrate 11. This field induces a charge in the surface of the semiconductor substrate which results in a change in the density of the mobile carriers. Thus, the surface conductivity can be either enhanced or diminished by the applied field.

The device can be fabricated by conventional techniques such as those presently employed in making metal-oxide-semiconductor (MOS) devices. The substrate 11 is a high resistivity semiconductor wafer, for example silicon having a resistivity of at least 10,000 ohm-cm. The low resistivity source and drain regions are of the same conductivity type and are formed in the substrate by the selective diffusion of impurities. The P* source region in the silicon substrate is doped so that its impurity concentration resides within the approximate range of $10^{18}$ to $10^{20}$ carriers per cubic centimeter. However, the drain region can be doped to $10^{21}$ carriers per cubic centimeter or more if desired. For ease of fabrication, both source and drain are doped to approximately the same concentrations. While the low resistivity regions are characterized by their carrier concentrations, the substrate is normally specified by its resistivity.

The substrate may be either high resistivity P type ($\pi$) or N type ($\nu$) material. The use of a high resistivity substrate insures that the conducting channel established at the surface thereof is not shunted by a low impedance conducting path. In addition, the high resistivity substrate enables the "off" state of the device to exhibit low leakage currents regardless of the conductivity type of the substrate. In an embodiment utilizing a $\pi$ substrate and P* source and drain regions, essentially no conduction occurs between the source and drain in the absence of an applied gate voltage due to the rectifying properties of a $P^*-\pi$ interface. The $P^*-\pi$ interface is found to exhibit properties very similar to those of a conventional PN junction except that when biased in the reverse direction the reverse leakage current does not saturate as it would in a PN junction diode. The characteristics of this interface are further described in the copending U.S. patent application Ser. No. 664,848, entitled Insulated-Gate Field Effect Transistors Utilizing a High Resistivity Substrate, by P. Richman and W. Zloczower and filed of even date herewith. These characteristics, also exhibited by an $N^*-\nu$ interface, rather than the high resistance of the conducting path through the bulk of the substrate permit the device to achieve the "off" state. In embodiments wherein the substrate and the source and drain regions are of opposite conductivity type, the "off" state is provided by the presence of a PN junction of the interface between a region and the substrate.

The lower limit of resistivity found acceptable for both P and N type substrates in the present device is 10,000 ohm-cm. However, in practice, the preferred range has been found to have a lower limit of about 34,000 ohm-cm. The upper limit on substrate resistivity is determined only by the intrinsic resistivity of the semiconductor material employed.

The regions 12 and 13 of the same conductivity type are generally separated by a distance of between 0.3 and 3.0 mils. This separation is the channel length shown in FIG. 1. The channel width is normally relatively large, for example about 50 mils, when compared with the channel length. The thickness of the insulating film primarily determines the gate input impedance. For an input impedance of about $10^{13}$ ohms, the film is chosen to have a thickness within the range of 1000 to 2000 Angstroms. The film 16 is readily provided by the oxidation of the substrate surface.

In the embodiment of FIG. 1, the source and drain regions are P type and the substrate 11 is $\pi$ material. The device is operated as a P-channel MOS transistor when a negative voltage is applied to gate electrode 17 by gate voltage source 21 and a negative voltage is applied to drain electrode 14 by voltage source 22. The negative gate voltage attracts holes from the bulk of the substrate to the surface thereof. This results in the formation of a P-type accumulation layer thereby establishing conducting channel 20. Essentially no conduction takes place through the bulk of the substrate due to the rectifying properties of the $P^*-\pi$ interfaces.

Figure 2:
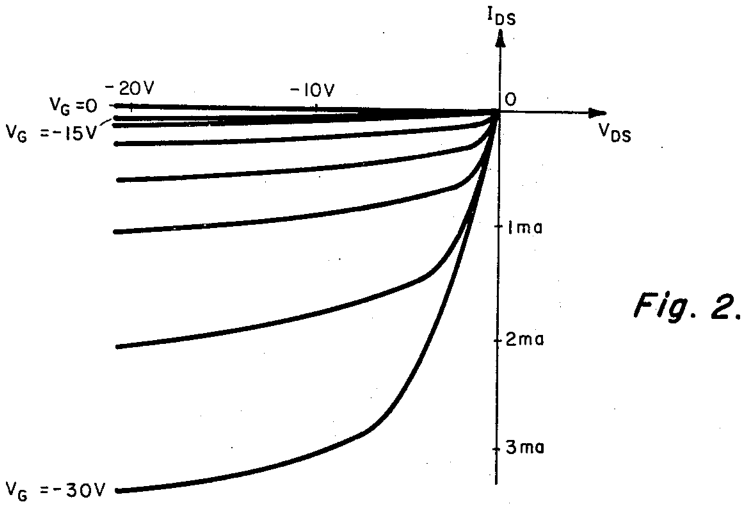
FIG. 2 is a series of curves illustrating the P channel operation of the embodiment of FIG. 1.

The electrical characteristics for the P channel mode of operation of the embodiment of FIG. 1 are shown by the curves of FIG. 2. It shall be noted that the current readily saturates. The zero gate voltage leakage current between the source and drain regions is of the order of 10 microamperes or less.

When the polarity of the gate and drain voltage is reversed, i.e., made positive, the device operates as an N channel MOS transistor. The positive gate voltage inverts the surface of the $\pi$ substrate by attracting electrons to the surface thereof. This results in the formation of an N-type conducting channel 20. As in the P channel mode of operation, no conduction will take place through the bulk of the substrate. The PN junction formed at the interface of the drain and channel is forward biased. However, a reverse biased PN junction is formed proximate to the source-channel interface. By overlapping the source region with the gate electrode, a portion of the source region is inverted to N type by the electric field. This field induced PN junction is found to break down by tunnel emission if the impurity concentration of the source region is within the range of $10^{18}$ to $10^{20}$ carriers per cubic centimeter. The breakdown of this reverse biased PN junction completes the conducting link between the drain and source. Thus, the device operates as an N channel MOS transistor. When the gate voltage is zero, the source inversion layer no longer is present and the conducting path from drain to source is broken, creating an "off" state.

The impurity concentration of source region 13 is required to be relatively low so that an inversion layer can be established within the source region at gate voltages lower than the breakdown voltage of the insulating layer. Breakdown of the layer is specified as the maximum field strength that the insulator can withstand and is typically of the order of $10^7$ volts/cm. It has been found that the maximum impurity concentration for an embodiment utilizing a silicon substrate is approximately $10^{20}$ carries per cm.$^3$. If the impurity concentration exceeds this amount, no inversion layer can occur in the source region at practical gate voltage levels. In addition, the gate electrode must overlap the source region by a distance of about 10 microns in order to establish the electric field therein necessary for the inversion. In practice, the preferred range for this overlap is from 10 to 25 microns. An increase in overlap in excess of 25 microns results in a significant increase in interelectrode capacitance.

Also, the tunnel emission which breaks down the PN junction in the source region requires that the impurity concentration be high enough to establish the region as degenerate. This minimum concentration is required to obtain the overlap between conduction and valence bands needed for tunnel emission. For silicon substrates, the source region concentration is at least about $10^{18}$ carriers per cm.$^3$.

Figure 3:
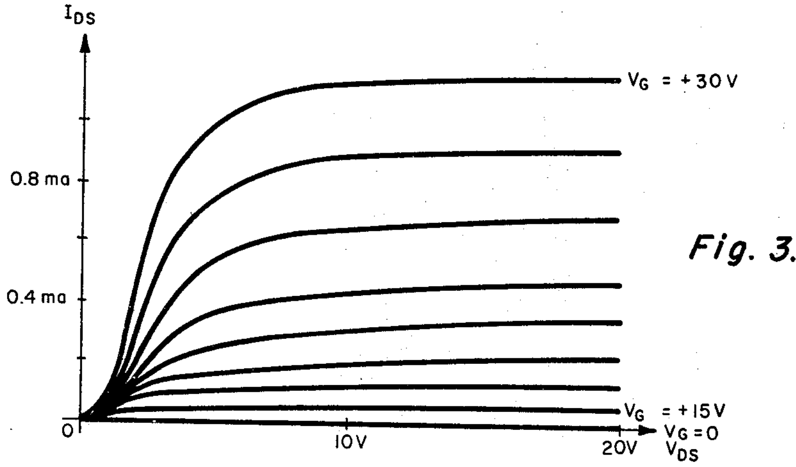
FIG. 3 is a series of curves illustrating the N channel operation of the embodiment of FIG. 1.
Figures 4, 5:
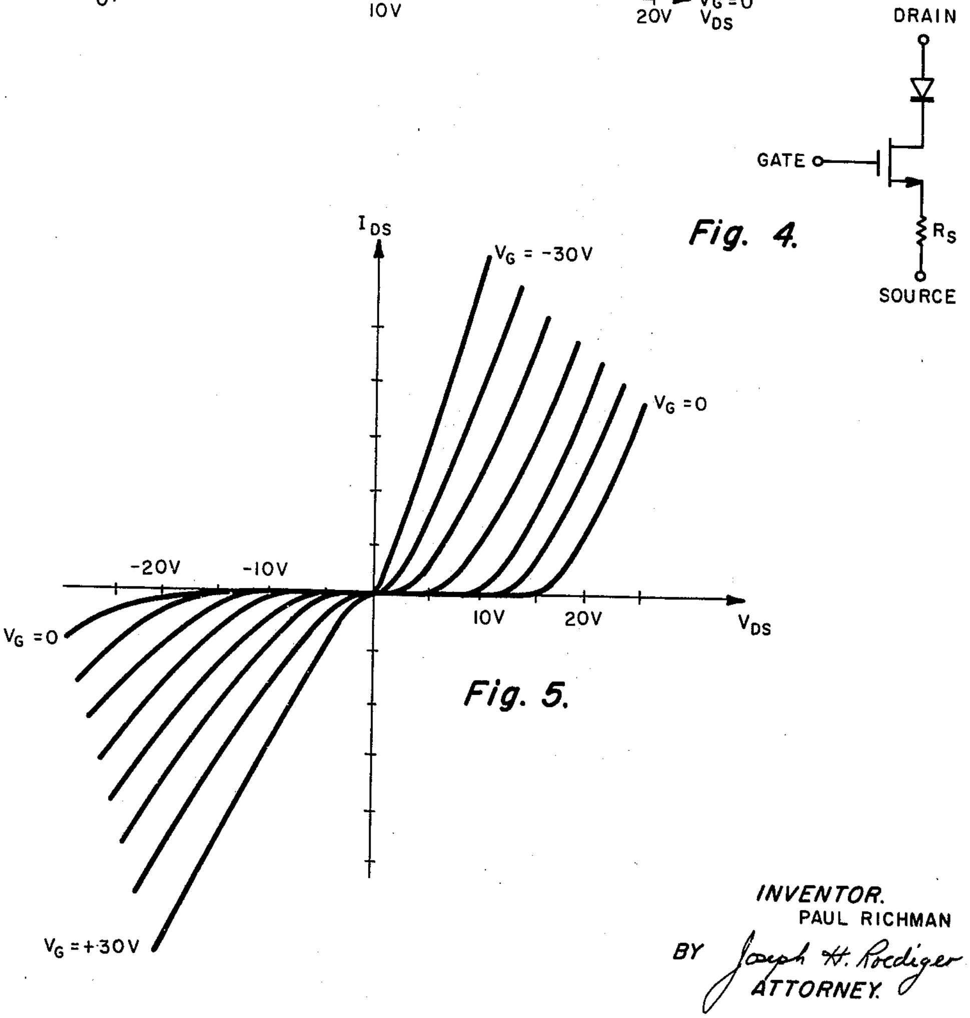
FIG. 4 is an electrical schematic showing the equivalent circuit for the N channel operation of the embodiment of FIG. 1.
FIG. 5 is a series of curves illustrating the triode region of operation of the embodiment of FIG. 1.

The electrical characteristics for the N channel mode of operation of the embodiment of FIG. 1 are shown by the curves of FIG. 3. Similar to the P channel mode, the current readily saturates and the zero gate voltage leakage current is of the order of microamperes or less. The N channel operation is characterized by a lower transconductance than that found in P channel operation due to the degeneration that results from the back impedance of the field induced junction. The effect of this degeneration can be represented as a series source resistance and is shown in the equivalent circuit of the device for N channel operation in FIG. 4. The diode in FIG. 4 is forward biased and corresponds to the PN junction formed at the drain-channel boundary.

The present MOS transistor is bipolar as shown by the curves of FIGS. 2 and 3. In addition, this transistor can be operated in the triode region wherein saturation does not take place. This type of operation is shown in the curves of FIG. 5 wherein the first quadrant corresponds to operation with a negative gate voltage and a positive voltage applied to the drain electrode. The third quadrant relates to operation with a positive gate voltage and a negative voltage on the drain electrode. Thus, the characteristics of the present transistor clearly illustrate that it is capable of operating in both modes depending only on the bias conditions.

Although the described embodiment refers to a bipolar MOS transistor utilizing a $\pi$ substrate in combination with P* source and drain regions, the description applies also to embodiments employing a $\nu$ substrate and N* regions. In addition, embodiments may be fabricated in which the conductivity type of the source and drain regions is opposite to that of the substrate. Also, it is apparent that many other modifications and variations may be made in the described embodiment without departing from the spirit and scope of the invention.

What is claimed is:

1. A bipolar field effect transistor comprising:

(a) a high resistivity semiconductive substrate of a single conductivity type, said substrate having a resistivity of at least 10,000 ohm-cm.;

(b) first and second regions of low resistivity formed in said substrate and having a separation therebetween, said regions having the same conductivity type, said first region having an impurity concentration which is at least as high as that necessary to establish the region as degenerate; and (c) means for modulating the surface conductivity of said substrate in the separation between regions, said means being formed on said substrate and overlapping said first region by a distance of at least 10 microns, whereby the application of a first polarity voltage to said means establishes an inversion layer in said region.

2. The field effect device of claim 1 in which said means for modulating the surface conductivity of said substrate comprises:

(a) an insulating film formed on said substrate and overlapping said first region; and (b) a gate electrode formed on said insulating film.

3. The field-effect device of claim 2 in which said first region has an impurity concentration which is at least as low as that required for the formation of an inversion layer therein at a field strength which is less than the breakdown field strength of said insulating film.

4. A bipolar field effect device comprising:

(a) a high resistivity semiconductive substrate of a single conductivity type;

(b) first and second regions of low resistivity formed in said substrate and having a separation therebetween, said regions having the same conductivity type as that of said substrate, said first region having an impurity concentration which is at least as high as that necessary to establish the region as degenerate; and (c) means for modulating the surface conductivity of said substrate in the separation between regions, said means being formed on said substrate and overlapping said first region by a distance of at least 10 microns, whereby the application of a first polarity voltage to said means establishes an inversion layer in said first region.

5. The field effect device of claim 4 in which said substrate has a resistivity of at least 10,000 ohm-cm.

6. The field effect device of claim 5 in which said regions have an impurity concentration within the range of $10^{18}$ to $10^{20}$ carriers per cubic centimeter.

7. The field effect device of claim 6 in which said means for modulating the surface conductivity of said substrate overlaps one of said regions by a distance within the range of 10 to 25 microns.

8. The field effect device of claim 7 in which said substrate has a resistivity of at least 34,000 ohm-cm.

References Cited

IEEE Transactions on Electron Devices, "The Insulated Gate Tunnel Junction Triode," by Hofstein et al., February 1965, pp. 66–76.

JERRY D. CRAIG, Primary Examiner

U.S. Cl. X.R.

307—304